United States Patent [19]

Bergeron et al.

[11] Patent Number: 4,457,820

[45] Date of Patent: Jul. 3, 1984

[54] TWO STEP PLASMA ETCHING

[75] Inventors: Steven F. Bergeron, Jericho; Bernard F. Duncan, Westford, both of Vt.

[73] Assignee: International Business Machines Corporation, Armonk, N.Y.

[21] Appl. No.: 334,181

[22] Filed: Dec. 24, 1981

[51] Int. Cl.³ .............................................. C23C 15/00
[52] U.S. Cl. .............................. 204/192 E; 156/626; 156/643; 156/646; 156/651; 156/657
[58] Field of Search ............... 156/626, 627, 643, 646, 156/650, 651, 654, 657; 204/192 E

[56] References Cited

U.S. PATENT DOCUMENTS

| | | | |
|---|---|---|---|
| 4,066,491 | 1/1978 | Ruh et al. | 156/644 |
| 4,182,646 | 1/1980 | Zajac | 156/643 |
| 4,289,188 | 9/1981 | Mizutani | 156/626 |
| 4,289,574 | 9/1981 | Radigan | 156/643 |
| 4,380,488 | 4/1981 | Reichelderfer et al. | 156/643 |

OTHER PUBLICATIONS

IBM Technical Disclosure Bulletin, vol. 21, No. 6, Nov. 1978, pp. 2327-2328.
IBM Technical Disclosure Bulletin, vol. 20, No. 3, Aug. 1977, p. 991.
A. C. Adams et al., Edge Profiles . . . , *J. Electrochem. Soc.*, Feb. 1981, vol. 128, No. 2, pp. 366-370.
Electrochemical Society, Fall Meeting, Oct. 9-14, 1977, "The Control of Plasma Etched Edge Profiles," E. C. D. Darwall, Ext. Abstract, vol. 77-2, pp. 400-401.
*Solid State Technology*, Sep. 1976, "The Versatile Technique of RF Plasma Etching, Part I-The Etch Profile," A. Jacob, pp. 70-73.
*IBM Technical Disclosure Bulletin*, vol. 20, No. 5, Oct. 1977, "Isotropic and Anisotropic Etching in a Diode System," H. M. Gartner et al., pp. 1744-1745.
*IBM Technical Disclosure Bulletin*, vol. 21, No. 10, Mar. 1979, "Two-Step Dry Process for Delineating Micro and Submicron Dimension Polysilicon Gates," L. M. Ephrath, p. 4236.
*IBM Technical Disclosure Bulletin*, vol. 22, No. 7, Dec. 1979, "Via Profiling by Plasma Etching with Varying Ion Energy," W. W. Koste et al., pp. 2737-2738.

*Primary Examiner*—G. L. Kaplan
*Assistant Examiner*—W. T. Leader
*Attorney, Agent, or Firm*—Theodore E. Galanthay; William N. Hogg

[57] ABSTRACT

A method of etching a variable thickness material on a substrate through an opening or openings is disclosed. The method includes a first etch step in which the material is isotropically etched until the substrate material is first exposed defining a first end point. Thereafter, a second anisotropic etch is performed until all of the remaining material at the opening or openings is removed.

Preferably the etching is by dry plasma etching and the first end point is detected by monitoring the change in concentration of a reactive species. The change is sharply defined by taking a second derivative of the curve of the change in intensity of the peak of the sensed species.

10 Claims, 8 Drawing Figures

TWO STEP PLASMA ETCHING

BACKGROUND OF THE INVENTION

In the etching of material on a substrate, particularly in plasma etching, it is necessary to etch openings through certain material in such a way as to accurately control the opening size and also accurately control the edge profiles and undercutting of the etched openings. One example of this is etching polysilicon on an $SiO_2$ base in the manufacture of semiconductor chips. The openings are etched through a mask and the edge contour should terminate at the substrate in vertical alignment with the edge of the mask.

In conventional isotropic etching, such as by plasma etching, the etch takes place laterally as well as vertically leaving an opening which has curved side walls. It is desirable that the etch terminate as soon as the material has been etched through to the substrate so that the edge of the bottom of the wall is exactly in vertical alignment with the opening in the mask. This is no particular problem if the material is of uniform thickness such that the etching at all locations is completed at the same time. However, there is normally significant variations in the thickness of the material being etched. Therefore, if the etch is continued to completion at the thickest part, there will be significant detrimental undercutting or etch bias of the thinner parts where the vertical etching terminates sooner, but the horizontal etching continues. Using anisotropic etching to eliminate any undercutting will not solve the problem since the walls will turn out vertical rather than with the desired curvature.

SUMMARY OF THE PRESENT INVENTION

According to the present invention, a method of etching at least one opening in a given material on a substrate of a different material where said given material has a variable thickness at the locations to be etched is provided. The method includes the steps of first isotropically etching the regions to be etched in a dry gas atmosphere, detecting the point of completely etching away of said given material at some location to first expose the surface of the substrate material at said location, and thereafter anisotropically etching the remainder of the given material in said regions until it has been completely removed in said regions. Preferably, the initial end point of removing the given material at the said location thereof to first expose the substrate is detected by monitoring the emission band, or peak, of a reactive species involved in said etching and terminating the etching at a particular location on the plot of the intensity of said band, or peak. Preferably, a second derivative of the plot of said curve is used to determine and timely recognize said initial end point.

DESCRIPTION OF THE PREFERRED EMBODIMENT

According to the present invention, an improved method is provided to etch openings in a material wherein the openings require precisely controlled size and side contours. This technique finds particular application in the processing of silicon wafers for integrated circuit chips, and the invention will be described for this particular application. It is to be understood, however, that it has such wider application, and can be used wherever such close tolerances of size as well as contour must be achieved in etching patterns. The invention will also be described in an embodiment of etching polysilicon on a substrate of $SiO_2$. However, it can be used on any material that can be selectively etched through a mask.

Figure 1:
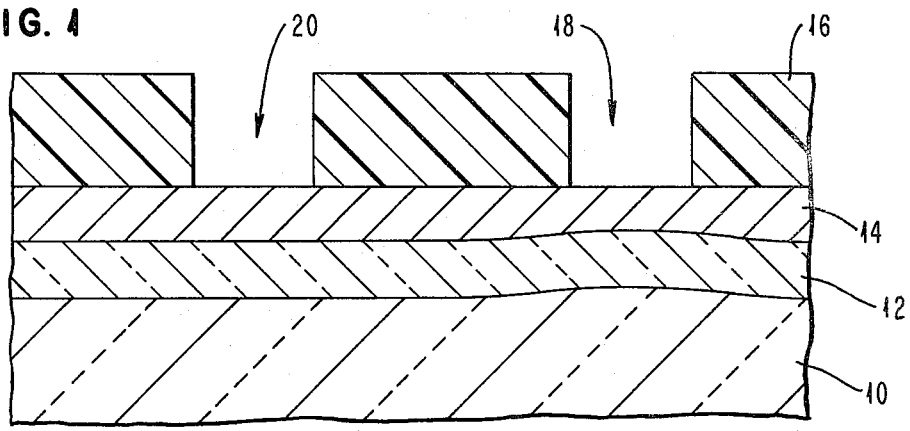
FIG. 1 is a transverse sectional view of a portion of a silicon chip masked and ready for etching.

Referring now to the drawing, and for the present to FIG. 1, a section through a particular silicon wafer during a step in the processing is shown. The silicon wafer, designated by the reference character 10, has grown thereon a thin film of silicon dioxide ($SiO_2$) 12. On top of the $SiO_2$ is a layer of polysilicon 14, which is to be etched in a given pattern. Overlying the polysilicon 14 is a mask of photoresist 16 which has been exposed and developed to define a pattern corresponding to the pattern to be etched in the polysilicon 14. Two of the openings of the pattern are shown and designated by the reference characters 18 and 20. Normally there are a great number of openings on each wafer but only two are shown for illustration.

Figure 2:
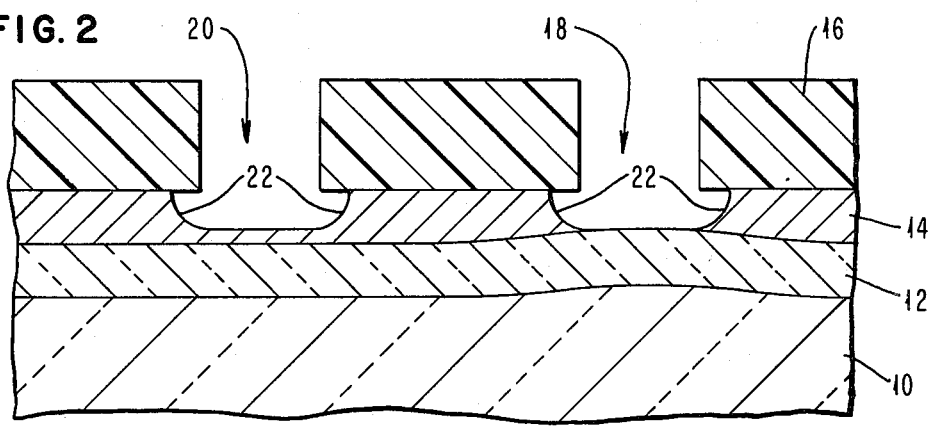
FIG. 2 is a view similar to FIG. 1 showing the progression of the etch according to this invention through the first step.
Figure 3:
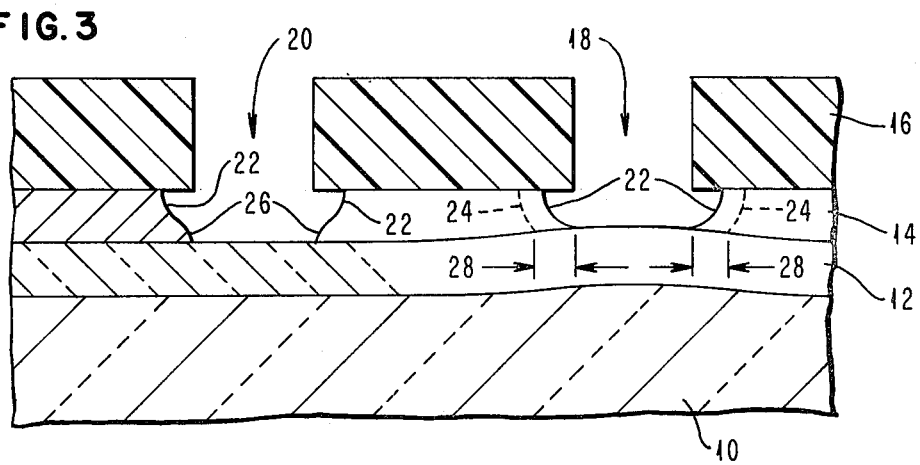
FIG. 3 is a view similar to FIG. 2 showing the progression of the etch according to this invention through the second step to completion.

In practice it is desirable that the thickness of each of the layers, and especially the polysilicon layer 14, be as uniform as possible. However, due to process limitation precise thickness control cannot be obtained, and this variation in thickness is depicted in FIGS. 1–3 by showing the polysilicon layer as being significantly thinner at the opening 18 than it is at opening 20. It is also possible that even at a given opening the thickness may vary from one side to the other. It is this variation in thickness of the polysilicon that makes it difficult to uniformly etch completely through the polysilicon at each opening and still maintain proper size and side contour control. This is because when the etching has been completed at one opening, i.e., 18, it is not completed at another opening, i.e., 20. If the etching continues, then the polysilicon at opening 18 will be over etched resulting in lateral undercutting and change in wall contour.

The two step process of this invention assures a complete etch at all locations without any significant etch bias or over etch resulting in undercutting with resultant loss of shape and dimension at the thinner locations of the material.

According to the present invention, a first plasma etch step which is isotropic in character is performed on the polysilicon 14. This can be done in radial flow parallel plate reactor such as a Model PK 24 manufactured by Plasma Therm Corporation of Kresson, N.J. The reactor can be operated with a mixture of $CF_4$ and $O_2$ gas with the upper plate powered to operate in a plasma etch mode. This will result in the performance of isotropic etching and will result in the polysilicon being removed.

The pattern of removal of the polysilicon is shown in FIG. 2. As can be seen, the polysilicon 14 is removed both directly under the openings 18 and 20 and curved sides 22 are formed under the photoresist. This is the result of the isotropic character of the etch. The exact contour of the sides and the etch rate is a function of the power, gas mixture, gas pressure and temperature all of which can be varied and regulated to control these characteristics as is well known in the art. This first step of isotropically etching is continued until all of the polysilicon is removed from a first region, which is shown at the opening 18. Expressed another way, the isotropic etching continues until it first breaks through the polysilicon and exposes the silicon dioxide below at some opening. At this point the curved sides 22 terminate at a point directly below the edge of the photoresist 16 forming the opening 18. This same curved configuration of the sides 22 is also present at the opening 20, with the curve terminating directly below the edge of the photoresist defining the opening 20. However, at the opening 20 the polysilicon has not been completely removed, there still being an apprecible thickness left on the $SiO_2$ within the opening 20.

If the isotropic etch were to continue to remove the polysilicon remaining at opening 20, then undercutting or an etch bias would be introduced to the polysilicon at the opening 18. This simply means that the etch would continue laterally, changing the shape of the walls 22 and moving these walls back to the position shown in dotted lines and designated 24 in FIG. 3. Thus, this opening would be significantly enlarged and the curvature of the sides would be substantially altered.

To maintain the same opening size and not enlarge the size of the opening generated at 18 but still remove the remaining polysilicon material at the opening 20, after the initial breakthrough of the polysilicon to expose the $SiO_2$ therebelow is detected, which will be referred to as the initial or first end point, the isotropic etching is discontinued.

At this point anisotropic etching is commenced. Anisotropic etching will etch only the polysilicon directly in line with the openings 18 or 20 and will not etch laterally. One technique for anisotropic etching employs the same device used for isotropic etching but varies the etching medium. One medium that can be used is $C_2F_5Cl$ and $O_2$ mixed. This can also be done as plasma etching powering only the upper electrode. Thus, the work pieces can be left in the same tool and only the atmosphere charged, and then anisotropic etching can be performed with the selection of the desired power, gas pressure, gas mixture and temperature as is known in the art.

The anisotropic etching continues until all of the remaining polysilicon in all of the openings is removed. This condition is represented in FIG. 3 by the solid lines. As can be seen in FIG. 3, the curvature of sides of the polysilicon in the opening 20 has been changed slightly at the lower end as shown at 26, but this slight change is perfectly acceptable. The anisotropic etch will not have any effect on the polysilicon adjacent the opening 18 since it does not etch laterally nor does it etch the $SiO_2$ underlayer; hence, there will be no undercutting as would have occurred with continuation of isotropic etching.

Thus, by this two step method of isotropic etching through openings until the polysilicon has been completely removed at a first given location, and thereafter anisotropically etching until all of the polysilicon is removed will provide openings with precisely controlled size and wall shape.

Of course, in practicing the two step isotropic/anisotropic etching on a commercial basis, it is necessary to accurately and consistently determine the first or initial end point, i.e., when the initial etch has first broken through the polysilicon and exposed the substrate and also when the second end point occurs, i.e., when all of the polysilicon exposed at all the openings is removed. It is necessary that these determinations be made irrespective of the total volume of product being processed, i.e., that various configured wafers and various numbers of wafers can be processed with the same accuracy of control. It is also necessary that the first and second end point be clearly determined for automatic control of any apparatus, and this is especially critical for the first end point detection which must be quickly and accurately recognized as it occurs to prevent etch bias or undercutting from occurring.

It has been found that by monitoring the emission spectra either of certain reactants or products, then plotting the intensity of these emissions and then taking the second derivative of the curves generated, a precise first or initial end point indication can be reliably and accurately determined and the process controlled to repeatedly terminate when the first or initial end point is reached irrespective of volume or bath size.

Figure 4:
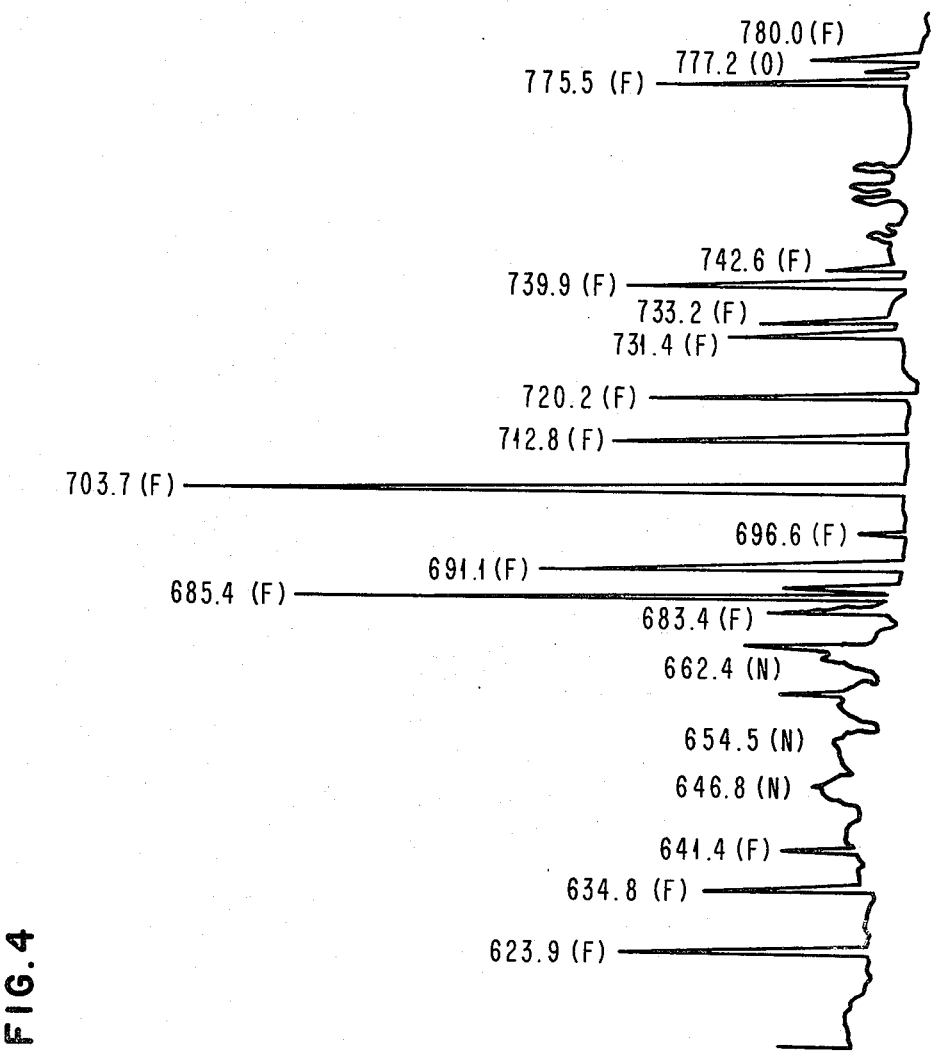
FIG. 4 is a representation of the emission spectra of a mixture of $CF_4$ and $O_2$ between 610 and 780 nanometers.

Referring now to FIG. 4, a representation of the emission spectrum of a mixture of $CF_4$ and $O_2$ plasma between 610 and 780 nanometers is shown. In this spectrum various Fluorine, Oxygen, and Nitrogen peaks are indicated. It has been observed that during etching the intensity of some of these peaks will vary in intensity, and some will not. With those peaks that do vary, the intensity stays relatively constant as long as the $SiO_2$ substrate is completely covered with polysilicon. As soon as the etch first breaks through polysilicon to expose the $SiO_2$ the intensity starts to change and this change continues until the polysilicon has been completely removed, at which time the intensity stablizes.

Figure 5:
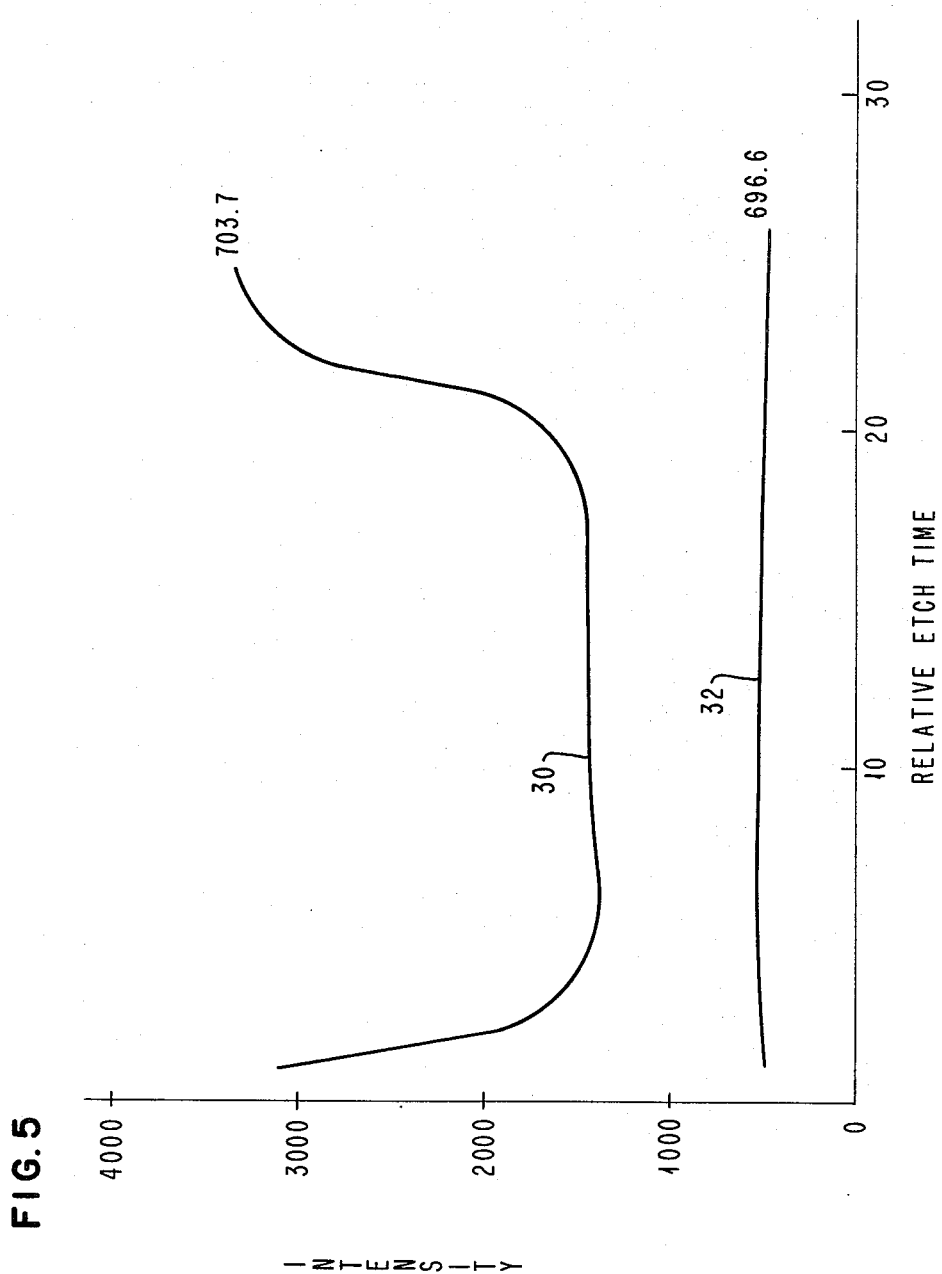
FIG. 5 is a plot of the intensity of the 703.7 F and 696.6 F bands during plasma etching.

A plot of two of the peaks shown in FIG. 4, i.e., the 703.7 Fluorine peak and 696.6 Fluorine peak is shown in FIG. 5, designated as lines 30 and 32, respectively, wherein the intensity is plotted on the Y axis and etch time on the X axis. As can be seen the 703.7 peak starts out at a given level and as etching starts drops to a level of about half the initial value. This lower level continues for a period of time after which the curve starts to rise and then levels off at about the initial value. At the point where this 703.7 curve starts to rise significantly, the first, or initial level, is just being reached, and where the curve levels off would be that point wherein all the polysilicon had been removed from the openings had the isotropic etching continued to the second end point. This indicates that the intensity of this peak is sensitive to the reaction.

However, the intensity of 696.6 Fluorine peak remains essentially constant both during the earlier etch period and thereafter. Hence, this peak is non-sensitive to the reaction. Thus, it would be good if the point at which the 703.7 peak makes a definite change upward could be reliably and accurately detected and used to control the termination of the isotropic etch. However, merely monitoring this curve does not provide the prerequisite precision and reliability for determining this initial end point for several reasons. First, while the intensity may be relatively constant during the etching cycle before the start of the change, the actual intensity of this may vary from sample to sample. Also, while the curve is relatively flat there still are variations of the readings and the processing of the signal to remove these variations cannot accurately be accomplished to provide an early enough awareness that this first or initial end point has been reached.

Figure 6:
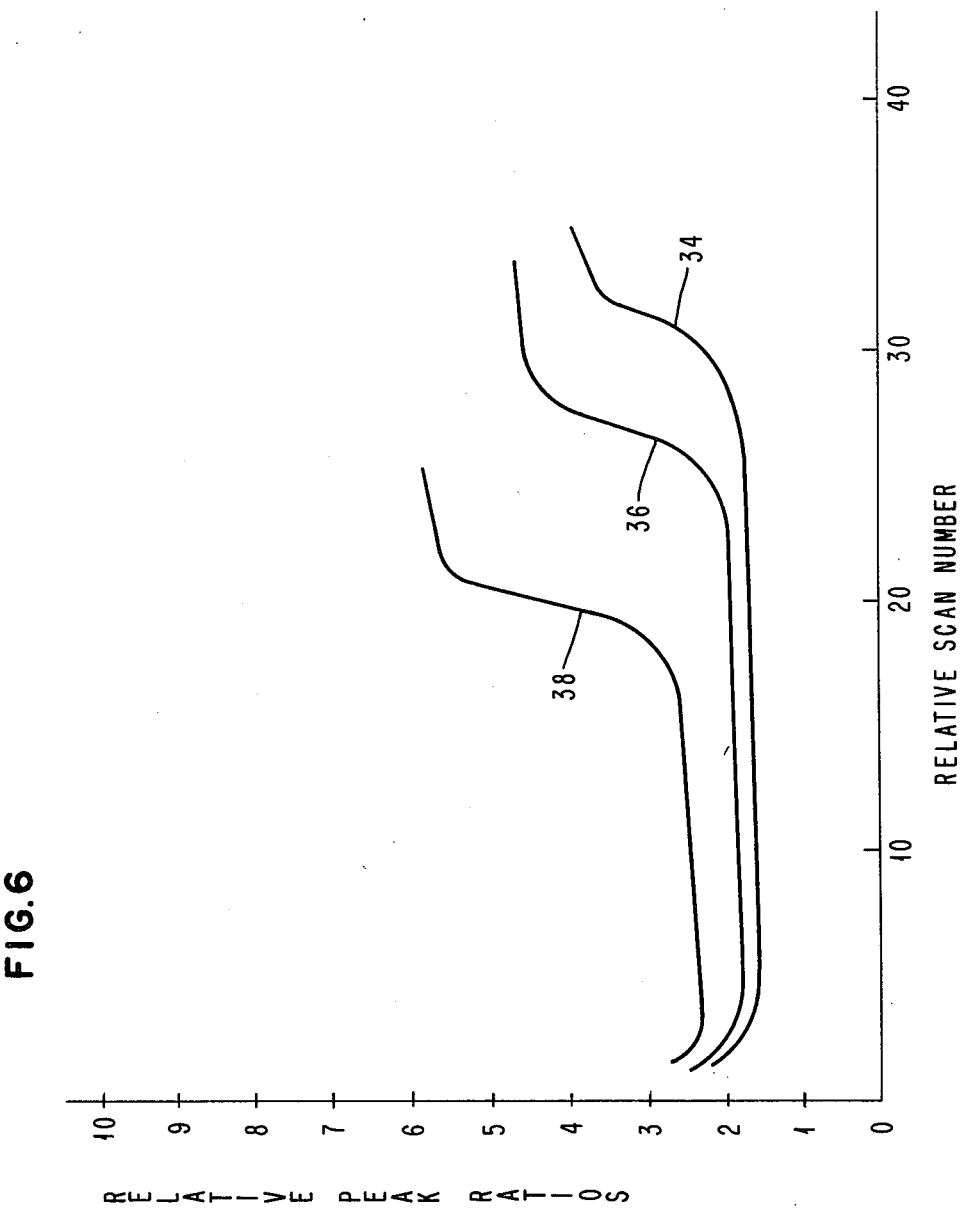
FIG. 6 shows plots of the relationship of the sensed intensity of the 703.7 band to the sensed intensity of the 696.6 band for several batch sizes of wafers during etching.

To overcome these difficulties, curves can be generated by utilizing the ratio of certain peak intensities, for example, the ratio of the 703.7 peak intensity to the 696.6 peak intensity. Since the 703.7 peak intensity changes when the first end point is being reached and continues to change until the second end point, and the 696.6 peak intensity remains constant, a plot of one divided by the other will remove any variations that are constant to the system as a whole. Three such cures are shown in FIG. 6. One curve 34 is plotted for 11 wafers as a batch, one curve 36 for 9 wafers, and one curve 38 for 7 wafers. While this removes the system variations and also provides a more precise shape of the curves, it still is sensitive to the amount of material being etched in the lot, and, hence, a specific intensity level would not be a proper indication in all cases.

Figure 7:
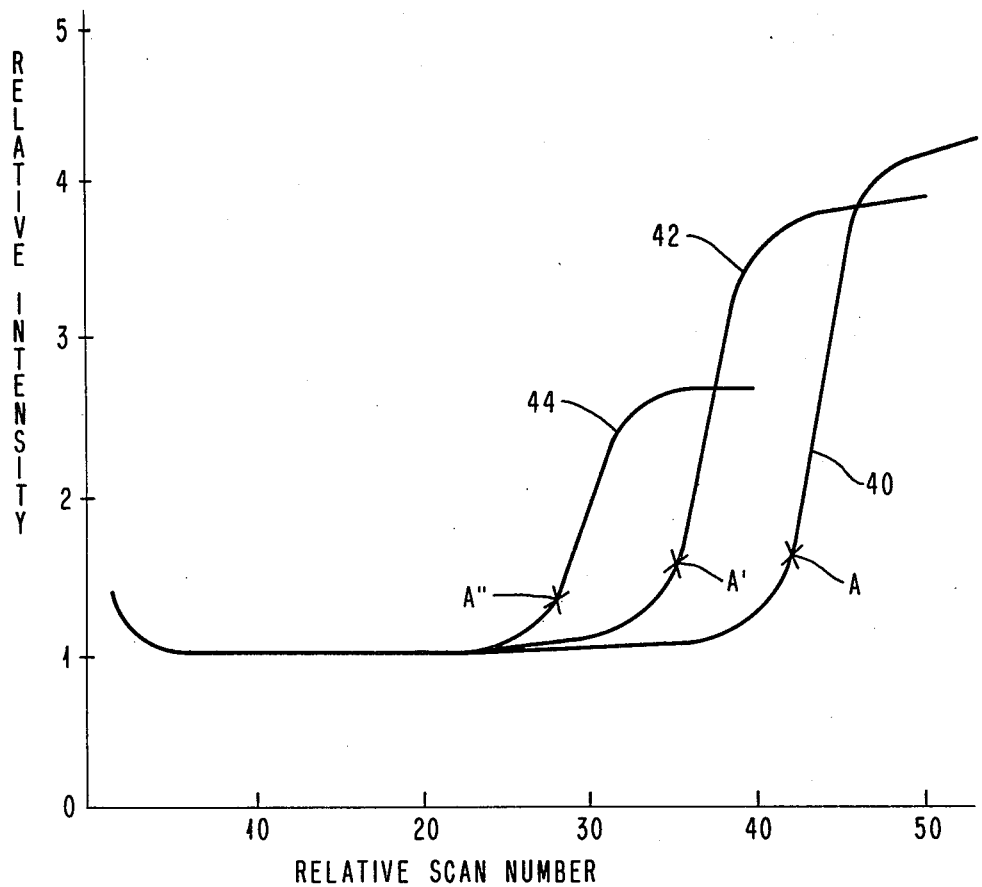
FIG. 7 shows plots of the relative intensity of the sensed intensity at a given time of the 703.7 band with respect to the immediately preceding sensed intensity of the 703.7 band for several batch sizes.

Another way of plotting the curve of the changing intensity is by sampling the intensity of the band which changes at designated intervals and dividing each sensed value by the immediately previously sensed value. Such a plot of curves 40, 42, and 44 of the 703.7 band intensity for wafer lot sizes of eight, six and four wafers, respectively, is shown in FIG. 7. While this removes the error due to size of the lot or volume of material being etched, it still shows a wide variant of the change in intensity with various lot sizes and volumns of material being etched. There are also several other problems in using curves in this form to control the actual stopping of the etching process at the proper point.

First, while theoretically the first or initial end point is exactly at the location when the curve starts to change, it has been found in practice that to assure that this first end point is actually a complete break through of a significant area of polysilicon to the substrate that the end point is slightly up the slope of the curve, approximately at the point A on curve 40, point A' on curve 42 and point A" on curve 44, as shown in FIG. 7. This is where the curve is starting to again change slope, about ¼ of the way up. Second, to actually control the process, it is necessary to have a very sharp, or clear, delineation of this point, and this delineation must be recognized when it occurs, not after the whole curve has been traced. Expressed another way, this point on the curve must be recognized when it occurs, though the rest of the curve has not yet been traced.

It has been found that this point can be definitely established and recognized when it occurs by taking a second deviation or second differential of the curve:

$$(d^2 I)/(dt^2)$$

Figure 8:
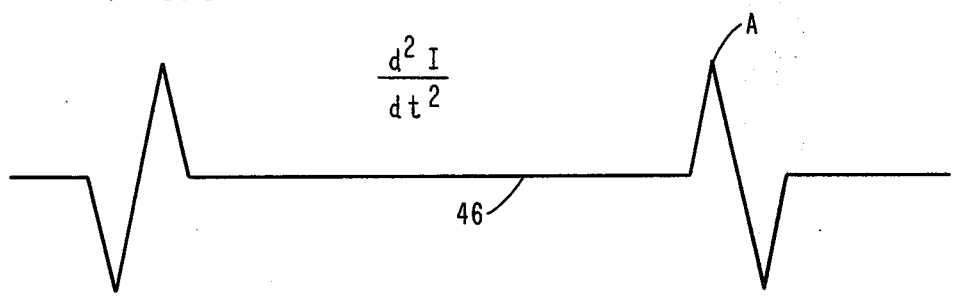
FIG. 8 is a plot of the second derivative of one of the curves of FIG. 7.

A plot of the second derivative of wafer curve 40 of FIG. 7 is shown in FIG. 8 as curve 46. The point labeled A in FIG. 8 corresponds to the point A on the eight wafer curve 40 in FIG. 7.

It can be seen that the point A of the curve in FIG. 8 is a very sharp peak. As can be seen in FIG. 8, this point A is represented by a very abrupt change from a very positive slope to a very negative slope in the curve. (This is actually a change in direction of the first derivative of this curve.) This is a readily observable point, clearly defined and can easily be recognized by either a machine or an operator; and it is easy to utilize as a machine or operator recognizable point to terminate the isotropic etching. Also, this point expressed as a second derivative can be easily recognized as it occurs and is not dependent upon the rest of the curve to be traced to be recognizable. Also, it will be apparent that point A on the curve in FIG. 8 not only corresponds to point A of the eight wafer curve of FIG. 7, but similar peaks, not so high and displaced to the left, are generated by taking the second derivative of curves 42 and 44 and correspond to points A' and A" of the six and four wafer curves, respectively, of FIG. 7. Thus, by using the second derivative of the curves of FIG. 7, the initial end point can be easily determined. Similar results can be obtained by taking a second derivative of the curves of FIG. 6, but the peaks are not quite so precise and do not have quite the same correspondence. A second derivative of the 703.7 curves of FIG. 5 would also show a similar characteristic, but would be even less precise and exacting. Thus, it is preferred that the curve of FIG. 7 be used for the second derivative.

Once the initial end point is detected, as by monitoring the curve of FIG. 7 and taking the second derivative, the first or isotropic etch process is stopped, which operation preferably is performed responsive to a signal generated by the monitoring device when the peak A is sensed and the slope changes from positive to negative. One very suitable device for monitoring the intensity, plotting the curves, performing the second derivative calculation and initiating the stop process signal is an optical multichannel analyzer, such as the OMA 2 manufactured by Princeton Applied Research Co., Princeton, N.J.

After the first end point is reached and the isotropic etch is terminated, the etch process is completed, as indicated above, by anisotropic etching. The second or final end point of this opearation is not particularly critical, since over etching or damage to the substrate cannot occur during the anisotropic etch, and similar techniques of measuring optical emission can be used to determine this final end point as is well known in the art.

What is claimed is:

1. An improved method of etching at least two openings in a given material on a substrate of a different material wherein said given material has a variable thickness at the locations to be etched, comprising the steps of first isotropically etching the regions to be etched, detecting the initial end point at which a portion of said material is completely etched away at some location to expose the surface of said diferent material at said location, and thereafter anisotropically etching the remainder of said given material until it has been completely removed from all of the etch locations.

2. The invention as defined in claim 1 wherein the etching is performed in a gas atmosphere.

3. The invention as defined in claim 2 wherein the etching is done by plasma etching.

4. The invention as defined in claim 3 wherein the initial end point is determined by:
   a. selecting at least one emission band of one of the species involved in the etching reaction which changes in intensity responsive to the reaction at the initial end point;
   b. monitoring the intensity of said band during etching to produce a curve of said monitored results;
   c. utilizing the monitored intensity to provide a recognizable point on said curve where said initial end point occurs as it occurs; and
   d. terminating said isotropic etch process responsive to said recognizable change in intensity of said emission band.

5. The invention as defined in claim 4 wherein the intensities of a plurality of emission bands are monitored, and wherein said change is monitored as a function of said two bands.

6. The invention as defined in claim 4 wherein the etching is done in an atmosphere which produces an active fluorine species, and the change in at least one fluorine band is said monitored band.

7. The invention as defined in claim 6 wherein the band is the 703.7 nm band.

8. The invention as defined in claim 4 wherein the utilizing of said monitored intensity includes successive monitoring of values and comparison with previously monitored values to establish a curve.

9. The invention as defined in claim 4, or 5, or 6, or 7, or 8, wherein said recognizable point is defined by taking the second derivative of the curve of the monitored intensity with respect to time to identify the initial end point.

10. In the method of claim 1 wherein a mask is provided overlying said given material, said mask defining a plurality of openings at the locations to be etched.

* * * * *